United States Patent
Chen et al.

(10) Patent No.: US 7,289,351 B1
(45) Date of Patent: Oct. 30, 2007

(54) METHOD OF PROGRAMMING A RESISTIVE MEMORY DEVICE

(75) Inventors: An Chen, Sunnyvale, CA (US); Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 67 days.

(21) Appl. No.: 11/166,572

(22) Filed: Jun. 24, 2005

(51) Int. Cl.
*G11C 11/00* (2006.01)
*G11C 16/04* (2006.01)
*G11C 11/14* (2006.01)
*G11C 11/15* (2006.01)

(52) U.S. Cl. ............ 365/148; 365/158; 365/163; 365/171; 365/173; 365/185.19

(58) Field of Classification Search ......... 365/148, 365/163, 185.19, 158, 171, 173
See application file for complete search history.

(56) References Cited

U.S. PATENT DOCUMENTS

| | | | | |
|---|---|---|---|---|
| 5,638,320 | A * | 6/1997 | Wong et al. | 365/185.03 |
| 6,621,745 | B1 * | 9/2003 | Manea | 365/185.23 |
| 7,084,691 | B2 * | 8/2006 | Hsu | 327/308 |
| 2004/0114419 | A1 * | 6/2004 | Lowrey et al. | 365/148 |
| 2004/0184331 | A1 * | 9/2004 | Hanzawa et al. | 365/203 |
| 2004/0264244 | A1 * | 12/2004 | Morimoto | 365/180 |
| 2005/0141261 | A1 * | 6/2005 | Ahn | 365/148 |

OTHER PUBLICATIONS

Reproducibleswitching effect in thin oxide films for memory applications, A. Beck, J. G. Bednorz, Ch. Gerber, C. Rossel, D. Widmer, Applied Physics Letters, vol. 77, No. 1, Jul. 3, 2000, pp. 139-141.
The role of space-charge-limited-currentconduction in evaluation of the electrical properties of them Cu2O films, A. E. Rakhshani,J. Appl. Phys. 69(4), Feb. 15, 1991, pp. 2365-2368.
Hysteretic current-voltagecharacteristicsand resistance switching at an epitaxial oxide Schottky junction SrRuO3/SrTi0.99Nb0.01)3,T. Fuji, M. Kawasaki, A. Sawa, H. Akoh, Y Kawazoe, Y. Tokura, Applied Physics Letters 86, 012107(2005),Dec. 23, 2004, pp. 1-3.
Current-driven insulator-conductortransition and nonvolatile memory in chromium-dopedSrTiO3 single crystals, Y. Watanabe,J. G. Berdnoz,A. Bietsch, Ch. Gerber, D. Widmer, A. Beck, S. J. Wind, Applied Physics Letter, vol. 78, No. 23, $ Jun. 2001, pp. 3738-3740.

* cited by examiner

*Primary Examiner*—Lý Duy Pham

(57) ABSTRACT

In an embodiment of a method of programming a resistive memory device, an electrical potential is applied to the gate of a transistor operatively associated with the resistive memory device, and successive, increasing electrical potentials are applied across the resistive memory device. In another embodiment of a method of programming a resistive memory device, an electrical potential is applied across the resistive memory device; and successive, increasing electrical potentials are applied to the gate of a transistor operatively associated with the resistive memory device.

14 Claims, 9 Drawing Sheets

Binned Current (uA)

FIGURE 9

METHOD OF PROGRAMMING A RESISTIVE MEMORY DEVICE

BACKGROUND OF THE INVENTION

1. Technical Field

This invention relates generally to memory devices, and more particularly, to resistive memory device operation.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, the scaling of conventional memory devices is approaching fundamental physical limits.

Therefore, there is a need to overcome the aforementioned deficiencies.

FIG. 1 illustrates a type of two-terminal memory device 30, which includes advantageous characteristics for meeting these needs. The memory device 30 includes an electrode 32, an active layer 34 on the electrode 32, and an electrode 36 on the active layer 34. Initially, assuming that the memory device 30 is unprogrammed, in order to program the memory device 30, ground is applied to the electrode 32, while a positive voltage is applied to electrode 36, so that an electrical potential $V_{pg}$ (the "programming" electrical potential) is applied across the memory device 30 from a higher to a lower electrical potential in the direction from electrode 36 to electrode 32. Upon removal of such potential the memory device 30 remains in a conductive or low-resistance state having an on-state resistance.

In the read step of the memory device 30 in its programmed (conductive) state, an electrical potential $V_r$ (the "read" electrical potential) is applied across the memory device 30 from a higher to a lower electrical potential in the direction from electrode 36 to electrode 32. This electrical potential is less than the electrical potential $V_{pg}$ applied across the memory device 30 for programming (see above). In this situation, the memory device 30 will readily conduct current, which indicates that the memory device 30 is in its programmed state.

In order to erase the memory device, a positive voltage is applied to the electrode 32, while the electrode 36 is held at ground, so that an electrical potential $V_{er}$ (the "erase" electrical potential) is applied across the memory device 30 from a higher to a lower electrical potential in the direction of from electrode 32 to electrode 36.

In the read step of the memory device 30 in its erased (substantially non-conductive) state, the electrical potential $V_r$ is again applied across the memory device 30 from a higher to a lower electrical potential in the direction from electrode 36 to electrode 32 as described above. With the active layer 34 (and memory device 30) in a high-resistance or substantially non-conductive state, the memory device 30 will not conduct significant current, which indicates that the memory device 30 is in its erased state.

Typically, programming of a memory device is achieved by applying a fixed number of voltage pulses at constant height across the device 30. Because of physical differences between memory devices in a memory device array, the electrical potential required to achieve programming can vary between memory devices. Applying a constant programming electrical potential to a memory device which is substantially greater than that required for programming can result in over-programming. Therefore, what is needed is an approach wherein, while proper programming of the memory device is achieved, application of excessive unneeded electrical programming potential is avoided.

Furthermore, the memory device as thus far shown and described is capable of adopting two states, i.e., a first, conductive state, or "on" state, and a second, substantially non-conductive, or "off" state. Each memory device thus can include information as to the state of a single bit, i.e., either 0 or 1. However, it would be highly desirable to be able to provide a memory device which is capable of adopting any of a plurality of states, so that, for example, in the case where four different states of the memory device can be adopted, two bits of information can be provided as chosen (for example first state equals 00, second state equals 01, third state equals 10, fourth state equals 11). This multi-level (ML) memory technology can significantly improve memory density and reduce cost per bit.

DISCLOSURE OF THE INVENTION

Various switching mechanisms have been utilized for memory applications. In this invention, the switching of the resistive memory is based on the Space-Charge-Limited-Conduction (SCLC).

In an embodiment of a method of programming a resistive memory device, an electrical potential is applied to the gate of a transistor operatively associated with the resistive memory device, and successive, increasing electrical potentials are applied across the resistive memory device. In another embodiment of a method of programming a resistive memory device, an electrical potential is applied across the resistive memory device; and successive, increasing electrical potentials are applied to the gate of a transistor operatively associated with the resistive memory device.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
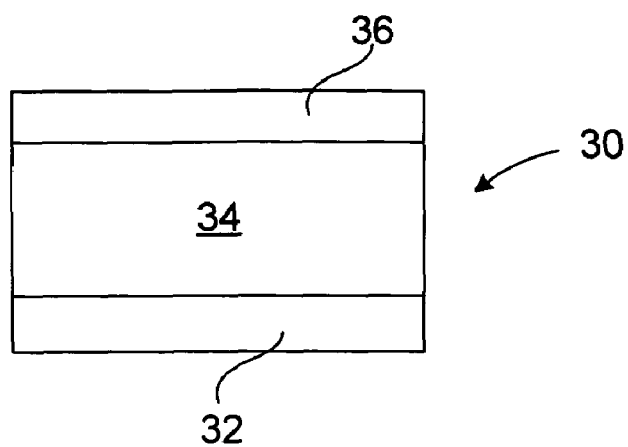
FIG. 1 is a cross sectional view of an above described resistive memory device.
Figure 2:
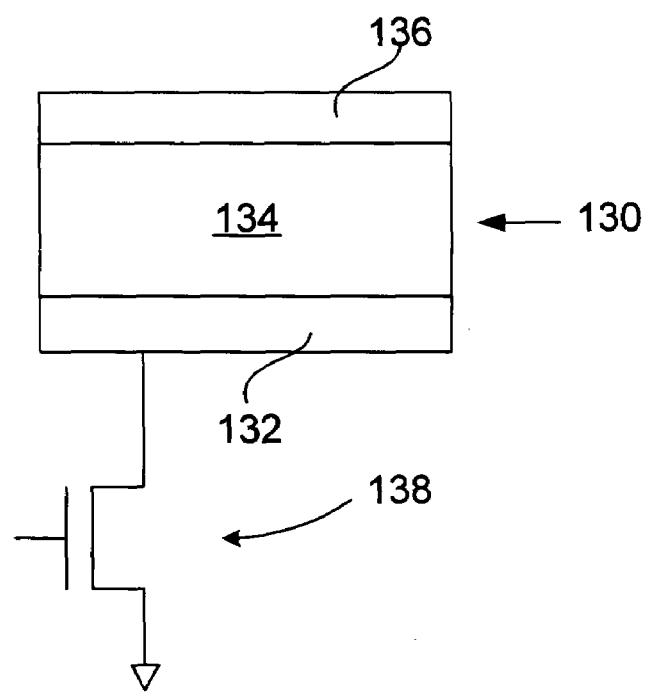
FIG. 2 is a cross sectional view of a resistive memory device/cell for practice with the present methods.

FIG. 2 illustrates the present resistive memory device/cell 130. Similar to the previously shown and described device 30, the resistive memory device 130 includes an electrode 132 (for example copper), an active layer 134, for example a copper oxide layer, on the electrode 132, and an electrode 136 (for example titanium) on the active layer 134. The electrode 132 is connected to the drain of an access MOS transistor 138, which has its source connected to ground. This circuitry is shown in schematic form in FIG. 2. The switching mechanism is explained based on the Space-Charge-Limited-Conduction model.

In a solid material with unfilled deep traps, SCLC current is significantly lowered from the trap-free case by a ratio $\theta$, determined by the trap depth ($\Delta E_t$) and density ($N_t$) as $\theta \propto \exp(\Delta E_t/kT)/N_t$. A dramatic resistance reduction occurs when the deep traps are filled at the traps-filled-limit voltage ($V_{TFL}$) that is determined by the unfilled deep trap density. After that the material is switched from a high-resistance state ("OFF") into a low-resistance state ("ON"). The ON state retention is determined by the "thermal release time" (de-trapping through thermal processes) that is exponentially proportional to $\Delta E_t$.

Figure 3:
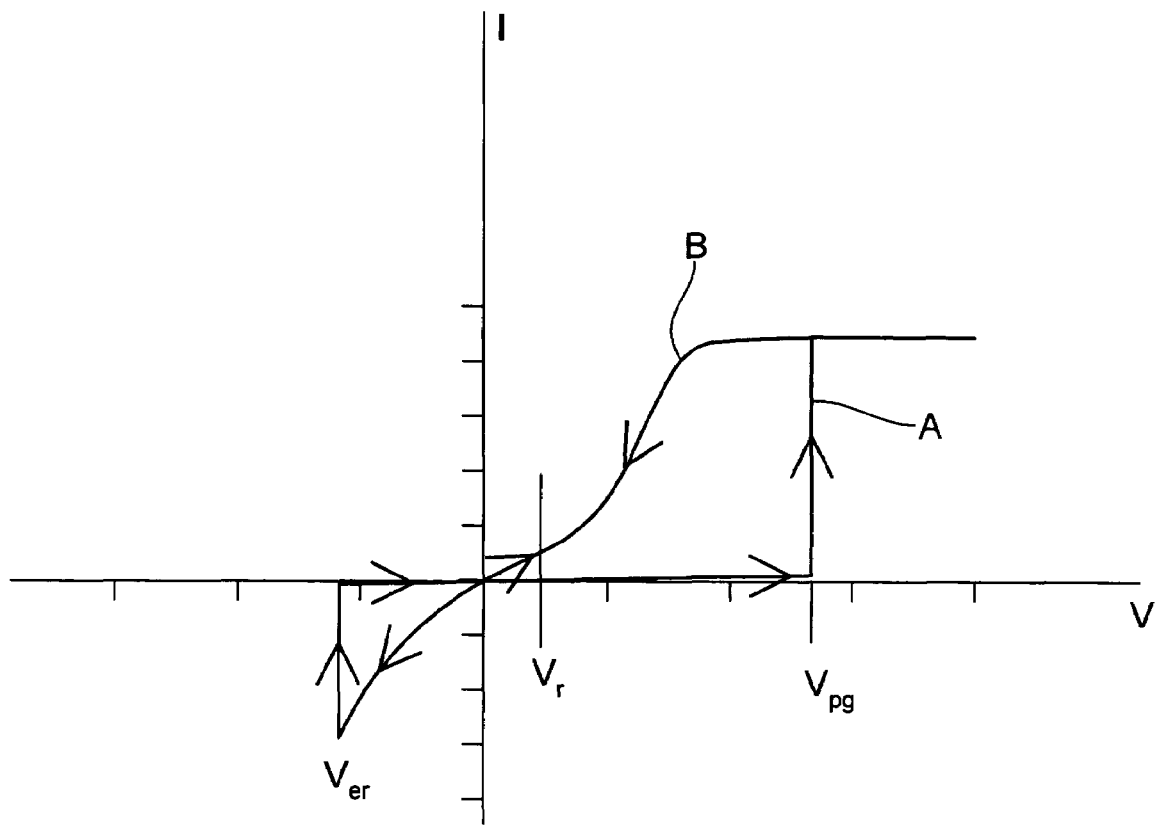
FIG. 3 is a plot of current vs. voltage illustrating operating characteristics of the memory device of FIG. 2.

FIG. 3 is a plot of memory device current vs. electrical potential applied across the memory device 130. In order to program the device 130, a positive voltage is applied to electrode 136, so that an electrical potential $V_{pg}$ (the "programming" electrical potential) is applied across the memory device 130 from a higher to a lower electrical potential in the direction from electrode 136 to electrode 132. This causes electronic charge carriers in the form of electrons and/or holes to enter the active layer 134 and fill the traps in 134, to provide that the overall memory device 130 is in a conductive, low-resistance (programmed) state (A). Upon removal of such potential the memory device 130 remains in a conductive or low-resistance state having an on-state resistance indicated at (B), due to the long retention associated with deep trap levels.

In order to erase the memory device, an electrical potential $V_{er}$ (the "erase" electrical potential) is applied across the memory device 130 from a higher to a lower electrical potential in the direction of from electrode 132 to electrode 136. Application of this electrical potential causes electronic charge carriers to leave the traps in the active layer 134, so that the overall memory device is in a high-resistance (erased) state.

In this disclosure, two programming methods are provided which are applicable to this type of resistive memory device based on SCLC model.

In a first embodiment of the invention, a method of programming the memory device 130 (FIGS. 2 and 4) is provided. Initially, a constant voltage is applied to the gate of the transistor 138. This electrical potential is maintained while individual, successive, increasing electrical potentials in the form of voltage pulses are applied to the electrode 136 of the device 130. These voltage pulses, which may be as short as 10 ns, are separated by periods between the pulses when no voltage is applied to the electrode 136.

Figure 5:
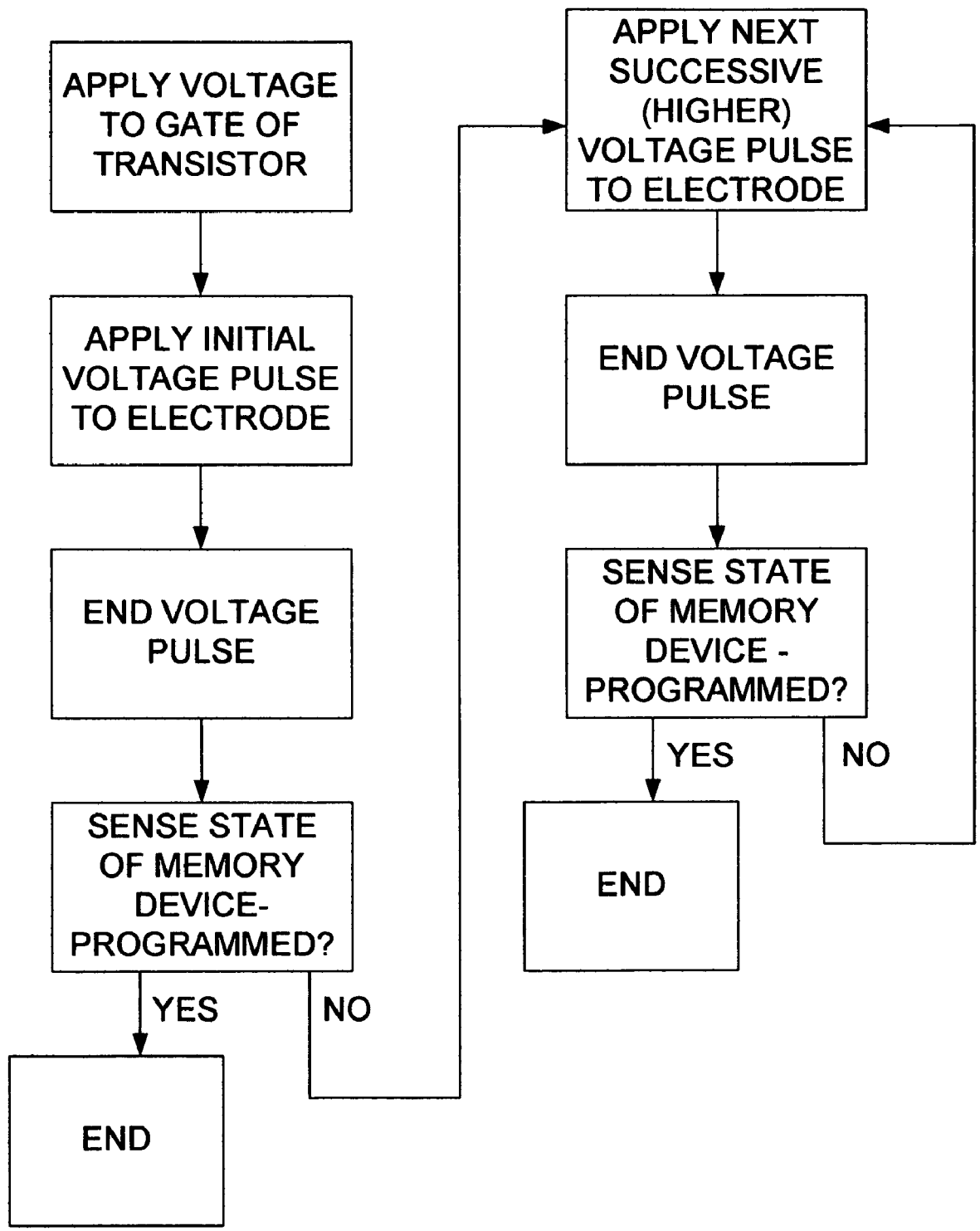
FIG. 5 is a flow chart illustrating steps in the method of FIG. 4.

By way of example, it is assumed that the present memory device 130 can be programmed by applying the level of voltage of the third voltage pulse applied to the electrode 136, but is not programmed by applying the level of voltage of the second voltage pulse to the electrode 136. Application of the next, fourth voltage pulse to the electrode 136 may result in over-programming. In order to avoid this problem, and with reference to FIG. 5, in the present process, after the voltage is applied to the gate of the transistor 138 as described above, the initial voltage pulse is applied to the electrode 136. After the first voltage pulse is ended, and before the beginning of the second, greater voltage pulse, the state of the memory device 130 is sensed by providing a read potential thereacross to determine if programming has been achieved. If so, application of voltage to the electrode 136 is ended, and the device 130 can be considered programmed. On the other hand, if such programming has not been achieved, the next successive (second) voltage pulse, greater in magnitude than the initial voltage pulse, is applied to the electrode 136. After this second voltage pulse is ended, and before the beginning of the third, greater voltage pulse, the state of the memory device 130 is sensed by providing a read potential thereacross to determine if programming has been achieved. Again, if the device 130 has been so programmed, application of voltage to electrode 136 is ended, and the device 130 can be considered programmed. If such programming has not been achieved, the process is continued as illustrated in FIG. 5 until programming of the device 130 has been achieved (in this example after the third voltage pulse but before the fourth voltage pulse).

Only the minimum number of successive, increasing voltage pulses on the electrode 136 are needed and used to program the device 130. This approach allows for efficient programming of devices which may have different programming characteristics. That is, as the level of voltage on the electrode 136 is a ramped up through application of the successive voltage pulses, the programming process ends as soon as the level of voltage applied to the electrode 136 is sufficient to provide the chosen programming current through the device 130. This approach avoids the disturb problem described above.

Figure 6:
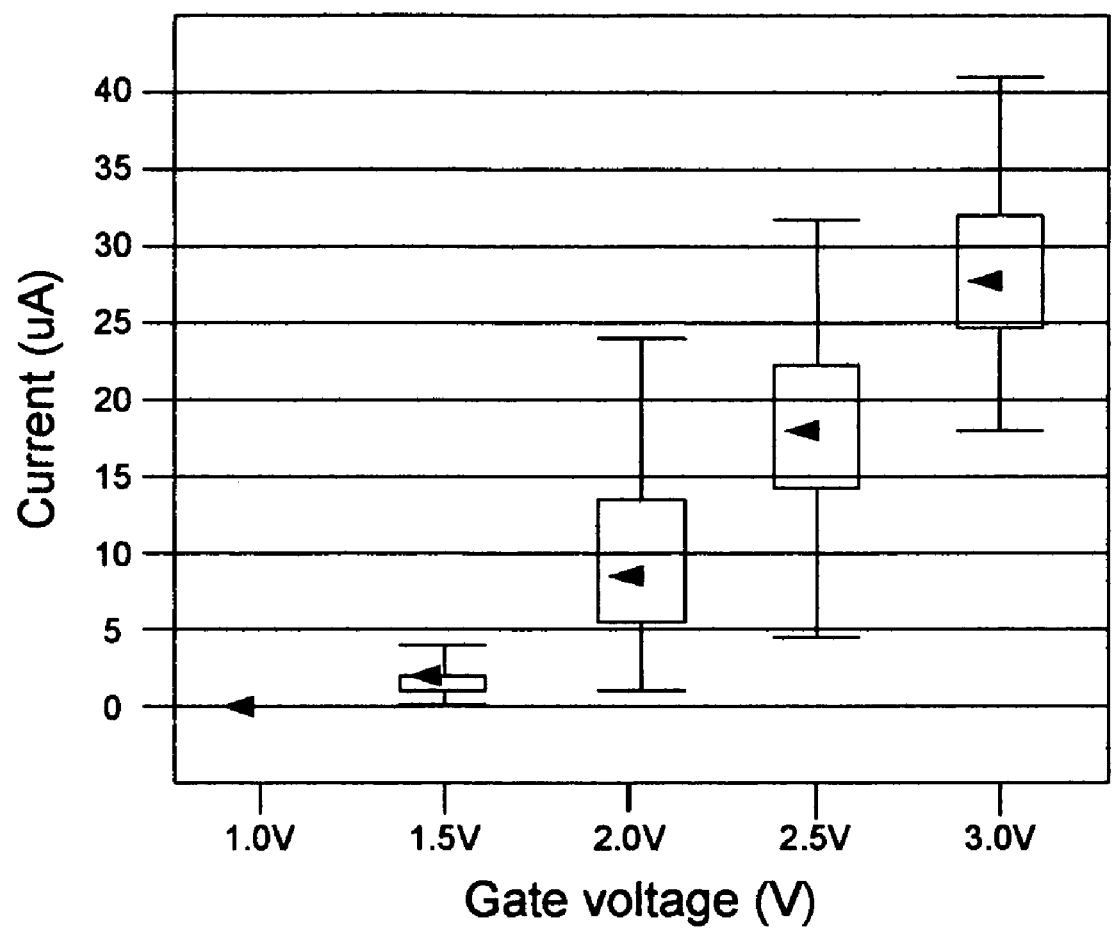
FIG. 6 is a graph illustrating characteristics of the device when practicing the method of FIGS. 4 and 5.

With higher current through the device 130 providing lower device 130 on-state resistance, a variety of different resistive states of the device 130 can be achieved. For example, four different memory states can provide two bits of information per memory device 130. Indeed, FIG. 6 illustrates five different resistive states of a memory device 130, each determined by the level of voltage applied to the gate of the transistor 138. The vertical dimension of each box of FIG. 6 illustrates the range of resistances of a plurality of devices 130 each programmed using the particular gate voltage shown (resistance indicated by the level of current through the device when applying a read potential of a chosen level). The arrow in each box represents the mean value of the distribution of the resistances for a plurality of devices 130. It will be seen that the variation range of on-state resistance is relatively small, so that the variation in on-state resistance from memory device to memory device is in turn small. Therefore, by choosing different gate voltages on the select transistor, this programming method with ramped voltage pulses across the memory cell provides the potential for multi-level programming.

It will be understood that further reduction in on-state resistance variation and creation of more distinct gaps between different on-state resistance ranges is desirable. Therefore, a second programming method is provided to further narrow the on-state resistance variation.

Figure 8:
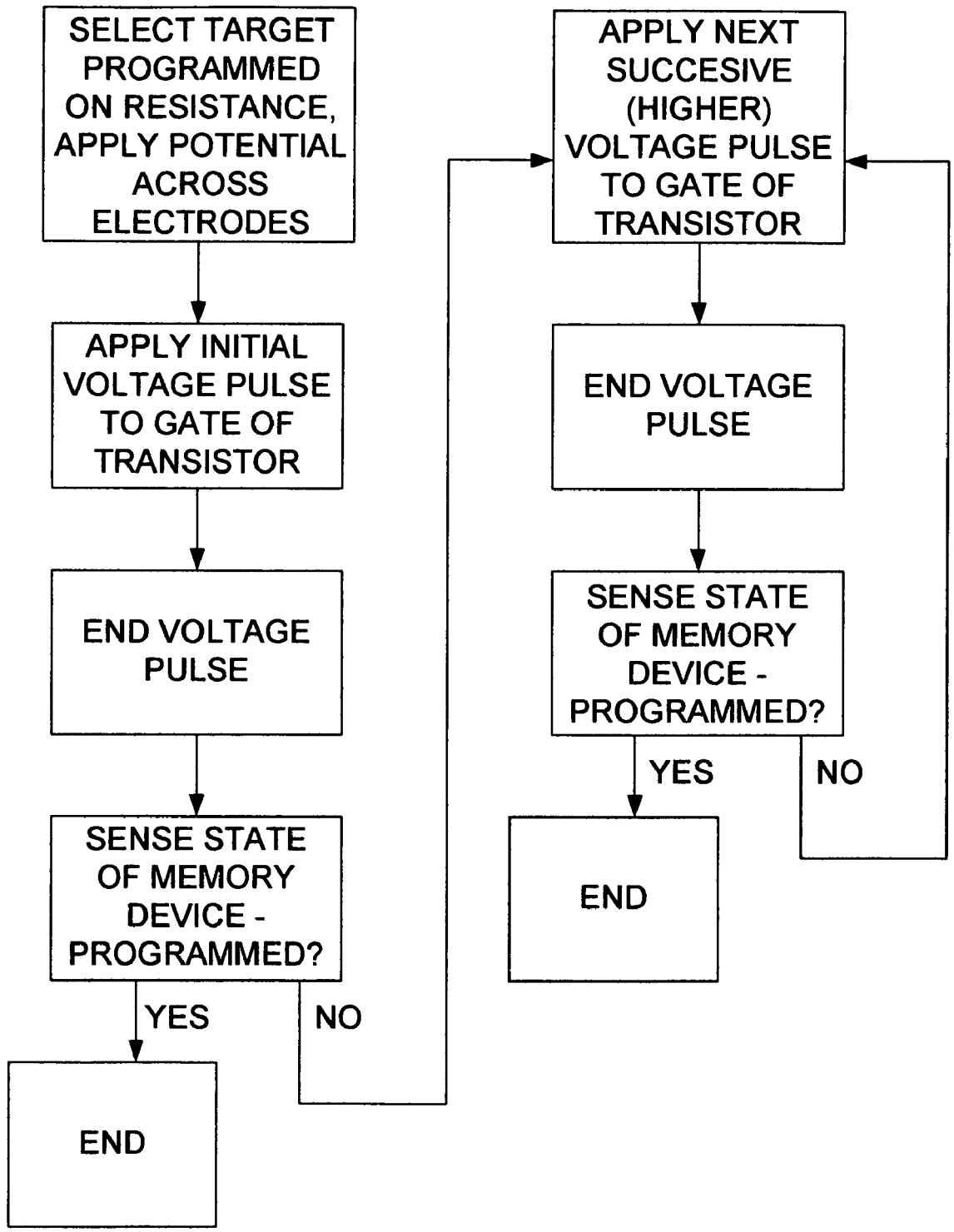
FIG. 8 is a flow chart illustrating steps in the method of FIG. 7.

In a second embodiment of the invention, another method of programming the memory device 130 is provided. Initially, a constant voltage is applied to the electrode 136 so that an electrical potential is applied across the device 130. This electrical potential is maintained while individual, successive, increasing electrical potentials in the form of voltage pulses are applied to the gate of the transistor 138. The successive voltage pulses, which again may be as short as 10 ns, provide successively increasing levels of current limit through the memory device 130. Assuming that the individual memory device 130 is to be programmed to provide a selected on-state resistance, such on-state resistance will be dependent upon the magnitude of the current limit allowed through the device 130 during programming. By way of example, for this particular memory device 130, it is assumed that the selected on-state resistance will be achieved by the level of current limit through the device 130 determined by the level of voltage of the third voltage pulse applied to the gate of the transistor 138, but not by the level of current limit through the device 130 determined by the level of voltage of the second voltage pulse applied to the gate of the transistor 138. Application of the next, fourth voltage pulse to the gate of the transistor 138 may result in over-programming. In order to avoid this problem, and with reference to FIG. 8, in the present process, after selecting the target programmed on-state resistance of the device 130, and after the voltage is applied to the electrode 136 as described above, the initial voltage pulse is applied to the gate of the transistor 138, providing a first level of current limit through the device 138. After the first voltage pulse is ended, and before the beginning of the second, greater voltage pulse, the state of the memory device 130 is sensed by providing a read potential thereacross to determine if the selected on-state resistance has been achieved, i.e., the device 130 has been properly programmed. If so, application of voltage to the gate of the transistor 138 is ended, and the device 130 can be considered programmed. On the other hand, if such programming has not been achieved, the next successive (second) voltage pulse, greater in magnitude than the initial voltage pulse, is applied to the gate of the transistor 130. After this second voltage pulse is ended, and before the beginning of the third, greater voltage pulse, the state of the memory device 130 is sensed by providing a read potential thereacross to determine if the selected on-state resistance has been achieved, i.e., the device 130 has been properly programmed. Again, if the device 130 has been so programmed, application of voltage to the gate of the transistor 138 is ended, and the device 130 can be considered programmed. If such programming has not been achieved, the process is continued as illustrated in FIG. 8 until the level of current through the device 130 is achieved to provide the chosen on-state resistance (in this example after the third voltage pulse but before the fourth voltage pulse).

It will be noted that again only the minimum number of successive, increasing voltage pulses on the gate of the transistor 138 are needed and used to program the device 130. This approach allows for efficient programming of devices which may have different programming characteristics. That is, as the level of voltage on the gate of the transistor 138 is a ramped up through application of the successive voltage pulses, the programming process ends as soon as the level of voltage applied to the gate is sufficient to provide the chosen programming current limit for programming through the device 130.

Figure 4:
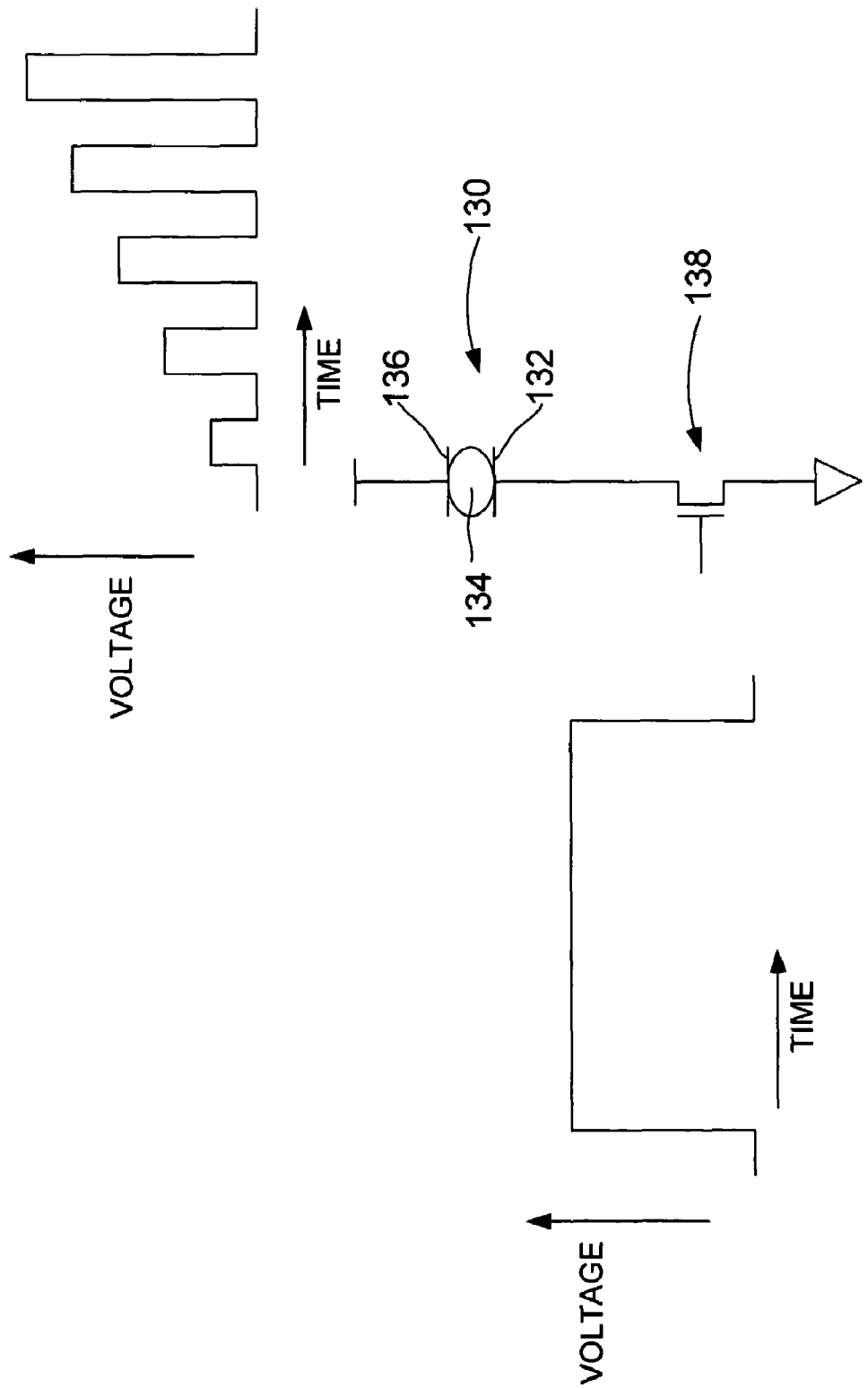
FIG. 4 is a schematic view illustrating programming of the device of FIG. 2 in accordance a first method.
Figure 7:
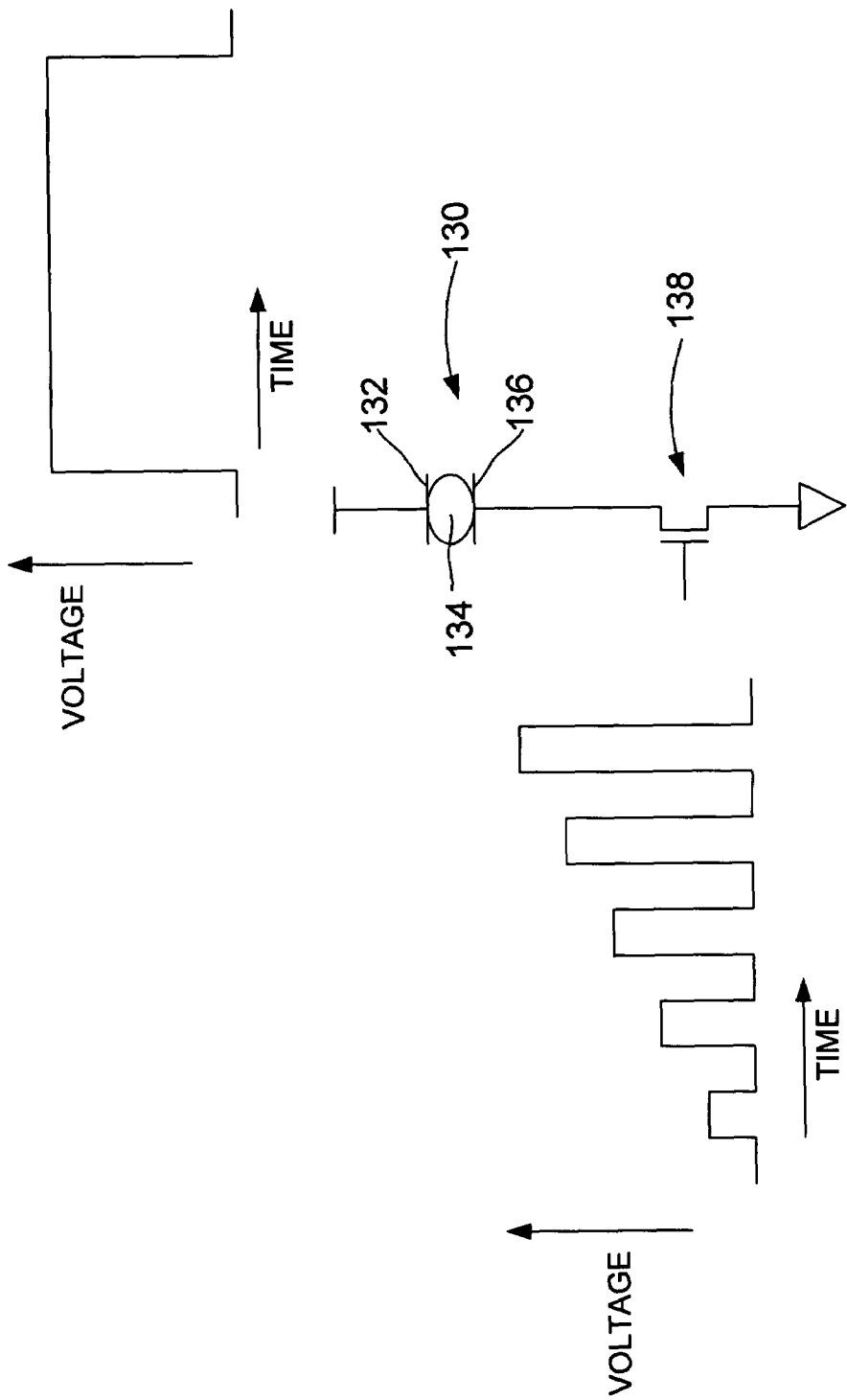
FIG. 7 is a schematic view illustrating programming of the device of FIG. 2 in accordance with a second method.
Figure 9A:
FIG. 9 is a graph illustrating characteristics of the device when practicing the methods of FIGS. 4 and 5, and FIGS. 7 and 8.
Figure 9B:
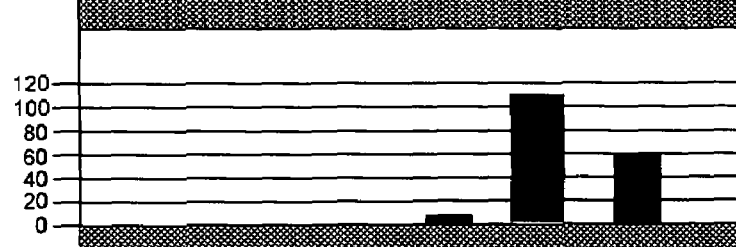
Figure 9C:
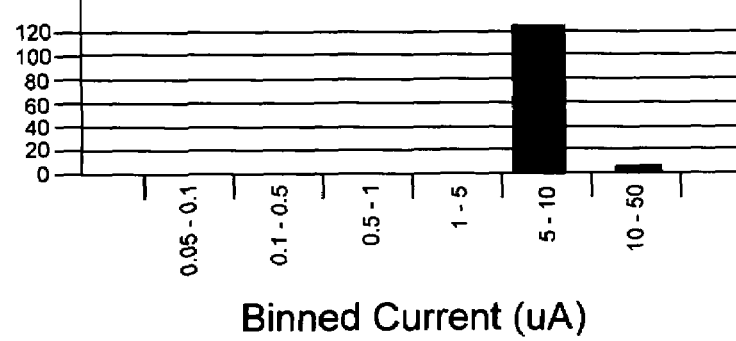

FIGS. 9A and 9B illustrate the distribution of on-state resistance of a plurality of devices 130 programmed by the method of FIGS. 4 and 5. With gate voltage at 2.0 V (FIG. 9A) and 2.5 V (FIG. 9B), the bars indicate the probability that an on-state current will be as noted when a chosen read potential is applied. While relatively high consistency is achieved, the method of FIGS. 7 and 8 provides further advantage. As shown in FIG. 9C, in programming a plurality of devices using ramped voltage pulses on the select transistor gate, the vast majority of devices, upon application thereto of the same read voltage, provide read current within the range 5-10 microamps. This indicates very high consistency of on-state resistances for the programmed devices. When different levels of on-state resistance are set for programming with this method, the memory cell on-resistance can reach different levels with narrow distribution. Therefore, multi-level programming can be achieved with this programming method by setting different on-state resistance targets.

Figure 10:
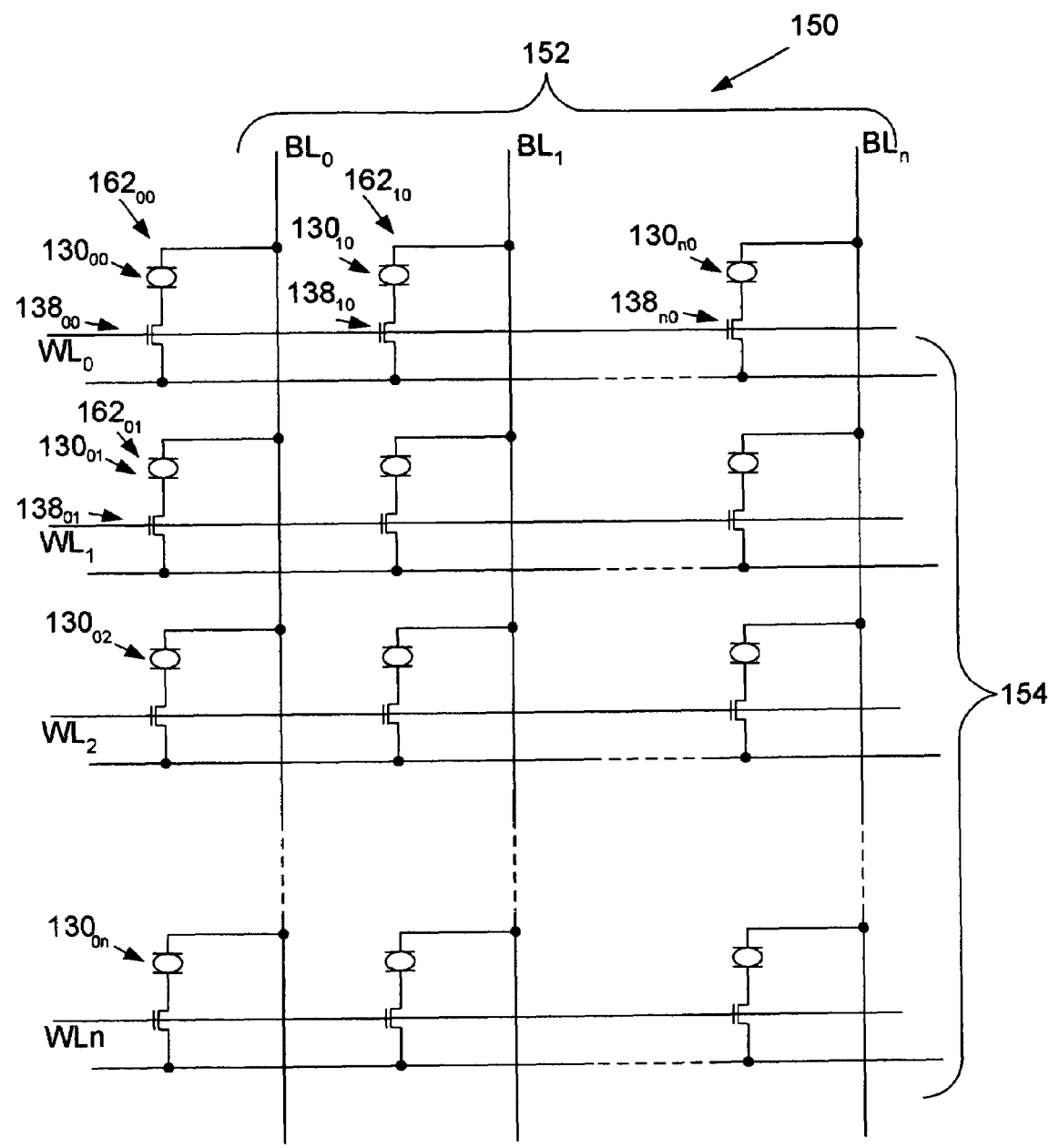
FIG. 10 is a schematic view of an array of memory devices for practice of the present invention.

FIG. 10 illustrates a high density memory device array 150 which incorporates memory devices 130 and transistors 138 as described above. As illustrated in FIG. 10, the memory device array 150 includes a first plurality 152 of parallel conductors (bit lines) $BL_0$, $BL_1$, . . . $BL_n$, and a second plurality 154 of parallel conductors (word lines) $WL_0$, $WL_1$, . . . $WL_n$ overlying and spaced from, orthogonal to, and crossing the first plurality of conductors 152. A plurality of memory devices 130 of the type described above are included, each in series with a transistor 138, to form a memory device-transistor structure 162. Each memory device 130 is connected in series with a transistor 138, with each word line connecting the gates of a row of transistors. The sources of the transistors in each row thereof are connected.

Both programming methods can be utilized in the memory array in FIG. 10, to provide uniform on-state resistance of memory cells across the memory array.

The foregoing description of the embodiments of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming a resistive memory cell comprising:
    applying an electrical potential across the resistive memory cell; and
    applying successive electrical potentials to the gate of a transistor operatively connected in series with the resistive memory cell, wherein the successive electrical potentials are successive increasing electrical potentials.

2. The method of claim 1, wherein programming of the resistive memory cell comprises moving electronic charge carriers in the resistive memory cell.

3. The method of claim 1 wherein the successive, increasing potentials are pulsed electrical potentials.

4. The method of claim 3, further comprising sensing the state of the resistive memory cell after each application of successive, increasing potential applied to the gate of the transistor.

5. The method of claim 4, wherein sensing the state of the resistive memory cell comprises reading the state of the resistive memory cell.

6. A method of programming a resistive memory cell to a selected on-state resistance comprising applying an electrical potential across the resistive memory device, and applying a minimum number of successive electrical potentials to the gate of a transistor operatively connected in series with the resistive memory cell to so program the resistive memory cell, wherein the successive electrical potentials are successive increasing electrical potentials.

7. The method of claim 6, wherein programming of the resistive memory cell comprises moving electronic charge carriers in the resistive memory cell.

8. The method of claim 6, further comprising sensing the state of the resistive memory cell after each application of successive, increasing electrical potentials.

9. The method of claim 8 wherein the successive, increasing electrical potentials are pulsed electrical potentials.

10. The method of claim 9, wherein sensing the state of the resistive memory cell comprises sensing the state of the resistive memory cell between pulses of electrical potentials.

11. The method of claim 10, wherein sensing the state of the resistive memory cell comprises reading the state of the resistive memory cell.

12. The method of claim 6, further comprising a plurality of said memory cells making up an array thereof.

13. A method of programming a resistive memory cell comprising:
    applying an electrical potential across the resistive memory cell; and
    applying increasing electrical potential to the gate of a transistor operatively connected in series with the resistive memory cell,
    wherein the increasing electrical potential is a plurality of successively increasing electrical potentials.

14. The method of claim 13, wherein the successively increasing electrical potentials are pulsed electrical potentials, and further comprising sensing the sate of the resistive memory cell after a pulse.

* * * * *